(12) United States Patent
Oki et al.

(10) Patent No.: US 9,081,031 B2
(45) Date of Patent: Jul. 14, 2015

(54) ELECTRICAL CURRENT SENSOR AND METHOD OF MANUFACTURING THE SAME

(71) Applicant: ALPS GREEN DEVICES CO., LTD., Tokyo (JP)

(72) Inventors: Naruaki Oki, Niigata-ken (JP); Yoshihiro Nishiyama, Niigata-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 300 days.

(21) Appl. No.: 13/741,244

(22) Filed: Jan. 14, 2013

(65) Prior Publication Data

US 2013/0221959 A1    Aug. 29, 2013

(30) Foreign Application Priority Data

Feb. 27, 2012   (JP) ................. 2012-040139

(51) Int. Cl.

| | |
|---|---|
| *G01R 33/02* | (2006.01) |
| *G01R 3/00* | (2006.01) |
| *G01R 19/00* | (2006.01) |
| *G01R 15/20* | (2006.01) |
| *G01R 33/028* | (2006.01) |

(52) U.S. Cl.
CPC ............. *G01R 3/00* (2013.01); *G01R 15/207* (2013.01); *G01R 19/0092* (2013.01); *G01R 33/02* (2013.01); *G01R 33/028* (2013.01)

(58) Field of Classification Search
CPC .. G01R 33/028; G01R 33/02; G01R 33/0283; G01R 33/025; G01R 33/09; G01R 33/091; G01R 33/098; G01R 33/093; G01R 29/0878; G01R 15/207; G01R 15/202; G01R 15/205; G01R 15/181; G01R 19/0092; G01R 21/06
USPC ............ 324/258, 107, 117 R, 177, 262, 263, 324/252, 228, 713, 244, 239, 248, 207.26; 701/30.8; 702/64; 38/32 R; 29/592.1
See application file for complete search history.

(56) References Cited

U.S. PATENT DOCUMENTS

| | | | | |
|---|---|---|---|---|
| 5,831,426 | A * | 11/1998 | Black et al. | 324/127 |
| 6,279,406 | B1 * | 8/2001 | Li et al. | 73/861.77 |
| 6,423,191 | B1 * | 7/2002 | Sorokov et al. | 204/192.12 |
| 7,106,046 | B2 * | 9/2006 | Nagano et al. | 324/117 H |
| 7,164,263 | B2 * | 1/2007 | Yakymyshyn et al. | 324/117 R |
| 7,557,562 | B2 * | 7/2009 | Myers et al. | 324/117 R |
| 7,564,238 | B2 * | 7/2009 | Sasaki et al. | 324/252 |

(Continued)

FOREIGN PATENT DOCUMENTS

| | | | | |
|---|---|---|---|---|
| CN | 101345117 A | * | 1/2009 | |
| GB | 2285331 A | * | 7/1995 | G11B 5/39 |

(Continued)

*Primary Examiner* — Patrick Assouad
*Assistant Examiner* — Sean Curtis
(74) *Attorney, Agent, or Firm* — Beyer Law Group LLP

(57) ABSTRACT

An electrical current sensor includes a first laminated body having a magnetic detection element disposed over a first substrate, a protective film formed over the first substrate and the magnetic detection element, and a coil formed over the protective film, and a second laminated body having a shield layer formed over a second substrate and which is formed by bonding the first laminated body and the second laminated body to each other with an adhesion layer interposed therebetween such that the magnetic detection element and the shield layer face each other.

8 Claims, 9 Drawing Sheets

(56) References Cited

U.S. PATENT DOCUMENTS

| | | | |
|---|---|---|---|
| 7,885,036 B2* | 2/2011 | Matono et al. | 360/125.12 |
| 8,618,796 B2* | 12/2013 | Teppan et al. | 324/253 |
| 8,884,606 B2* | 11/2014 | Myers et al. | 324/117 R |
| 2002/0114110 A1* | 8/2002 | Katakura et al. | 360/321 |
| 2004/0023065 A1* | 2/2004 | Daughton et al. | 428/693 |
| 2005/0201018 A1* | 9/2005 | Nagai et al. | 360/322 |
| 2006/0226826 A1* | 10/2006 | Teppan | 324/117 H |
| 2009/0309590 A1* | 12/2009 | Kataoka et al. | 324/244 |
| 2010/0067148 A1* | 3/2010 | Tsuchiya et al. | 360/245.3 |
| 2010/0301835 A1* | 12/2010 | Kasajima | 324/117 R |
| 2011/0193573 A1* | 8/2011 | De Boer et al. | 324/686 |
| 2011/0221436 A1* | 9/2011 | Ichinohe et al. | 324/252 |
| 2012/0038355 A1* | 2/2012 | Sasaki et al. | 324/244 |
| 2012/0074510 A1* | 3/2012 | Sasaki et al. | 257/422 |
| 2012/0112365 A1* | 5/2012 | Ausserlechner et al. | 257/777 |
| 2013/0015839 A1* | 1/2013 | Franke | 324/117 H |
| 2013/0119975 A1* | 5/2013 | Nakajima et al. | 324/117 R |

FOREIGN PATENT DOCUMENTS

| | | | |
|---|---|---|---|
| JP | 05073851 A | * | 3/1993 |
| JP | 2002-333468 | | 11/2002 |
| TW | 220164 B1 | * | 8/2004 |

* cited by examiner

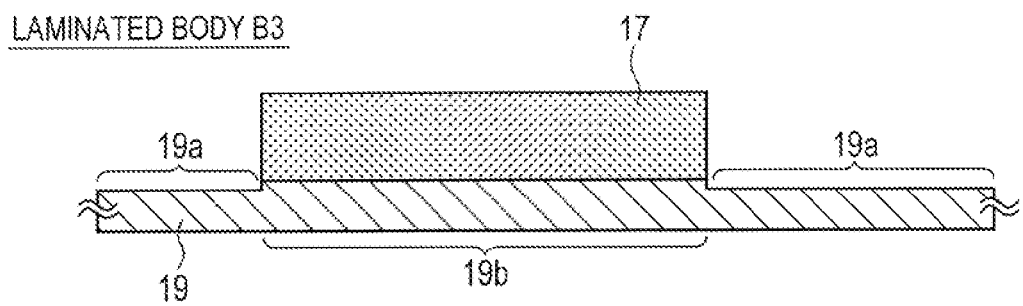
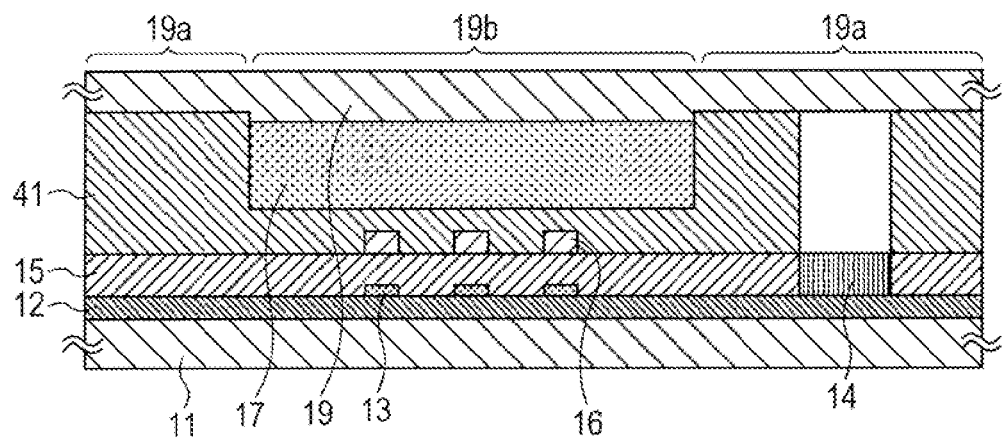
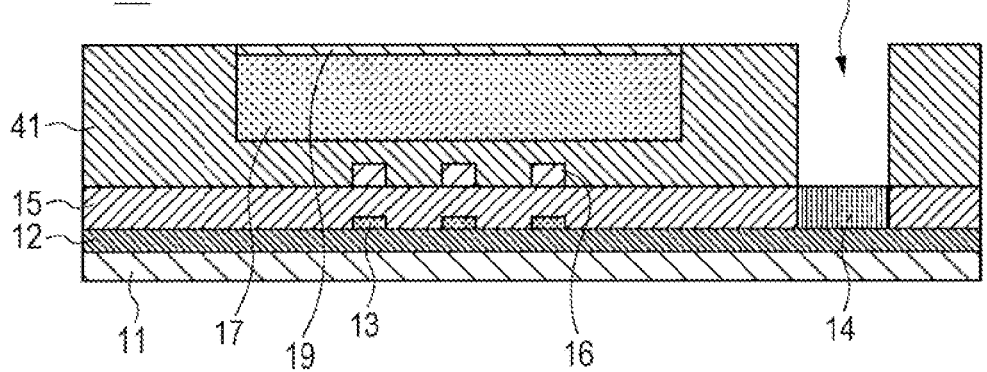

ELECTRICAL CURRENT SENSOR AND METHOD OF MANUFACTURING THE SAME

CLAIM OF PRIORITY

This application claims benefit of Japanese Patent Application No. 2012-040139 filed on Feb. 27, 2012, which is hereby incorporated by reference.

BACKGROUND OF THE INVENTION

1. Field of the Invention

The present invention relates to an electrical current sensor and a method of manufacturing the electrical current sensor.

2. Description of the Related Art

As an electrical current sensor, there is proposed an electrical current sensor of a type that detects a change in a magnetic field that is generated by an electrical current being measured, by using a magnetic detection element. As such an electrical current sensor, there is a magnetic balance type electrical current sensor having a structure as shown in, for example, FIG. 10A (refer to, for example, WO 2010/143718).

An electrical current sensor 100 shown in FIG. 10A includes a stress relaxation layer 102 and an aluminum oxide (Al2O3) layer 103 provided on a substrate 101, a plurality of magnetic detection elements 104 and an electrode 109 disposed on the aluminum oxide layer 103, a protective film 105 provided on the aluminum oxide layer 103 and the plurality of magnetic detection elements 104 so as to cover the magnetic detection elements 104, a plurality of coils 106 disposed on the protective film 105, a protective film 107 provided on the protective film 105 and the plurality of coils 106 so as to cover the coils 106, and a shield layer 108 disposed on the protective film 107.

The respective members constituting the electrical current sensor 100 are formed by laminating in order from the stress relaxation layer 102 on the substrate 101. Further, the shield layer 108 is formed to a thickness of 15 μm or more by, for example, a plating method.

In the electrical current sensor 100 shown in FIG. 10A, in order to form the shield layer 108 over the plurality of coils 106, it is necessary to form the protective film 107 (an insulating film) on the coils 106 and then form the shield layer 108 on the protective film 107. Further, in order to enhance the effects of the shield layer 108 of shielding a magnetic field being measured, and to strengthen the cancellation effects of the coils 106, it is necessary to make the protective film 107 thinner, thereby bringing the coils 106 and the shield layer 108 close to each other.

However, if the protective film 107 is made thinner, there is a problem in that the upper surface of the protective film 107 (the lower surface of the shield layer 108) has ripples formed by the shapes of the coils 106 (refer to FIG. 10B). Further, if the protective film 107 is made thinner, there is a problem in that cracks are easily generated in the protective film 107 due to the stress of the shield layer 108. If the magnetic detection element 104 is corroded due to absorption of water such as moisture through the cracks, the reliability of the electrical current sensor 100 is affected.

In addition, in the electrical current sensor 100 shown in FIG. 10A, in order to prevent warping of the substrate 101 due to the stress of the shield layer 108, it is necessary to provide the stress relaxation layer 102 on the substrate 101.

SUMMARY OF THE INVENTION

The present invention provides an electrical current sensor in which generation of cracks or warping of a substrate due to the stress of a shield layer can be prevented, and thus reliability, linearity, and hysteresis are good, and a method of manufacturing the electrical current sensor.

According to an aspect of the invention, there is provided an electrical current sensor including: a first laminated body having a first substrate, a magnetic detection element disposed over the first substrate, a protective film formed over the first substrate and the magnetic detection element, and a coil formed over the protective film; and a second laminated body having a second substrate and a shield layer formed over the second substrate, wherein the first laminated body and the second laminated body are bonded to each other with an adhesion layer interposed therebetween such that the magnetic detection element and the shield layer face each other.

Further, according to another aspect of the invention, there is provided an electrical current sensor including: a third laminated body having a first substrate and a magnetic detection element disposed over the first substrate; and a fourth laminated body having a second substrate, a shield layer formed over the second substrate, a protective film formed over the second substrate and the shield layer, and a coil formed over the protective film, wherein the third laminated body and the fourth laminated body are bonded to each other with an adhesion layer interposed therebetween such that the magnetic detection element and the shield layer face each other.

According to the electrical current sensor related to each of the above aspects of the invention, in the second laminated body (the fourth laminated body), the upper surface of the shield layer formed over the second substrate (the fourth substrate) is configured to be flat. In the electrical current sensor, the flat upper surface side of the shield layer is disposed to come close to the magnetic detection element, whereby it becomes possible to make the linearity and the hysteresis of the electrical current sensor good.

Further, according to the electrical current sensor related to each of the above aspects of the invention, since the substrate (the first substrate or the third substrate) on which the magnetic detection element is disposed and the substrate (the second substrate or the fourth substrate) on which the shield layer is formed are different substrates, in a case where cracks are generated in a lower surface edge of the shield layer formed over the second substrate (the fourth substrate), it becomes possible to choose not to use the substrate in the electrical current sensor. In this way, generation of cracks in the lower surface edge of the shield layer in the electrical current sensor is prevented, and thus it becomes possible to improve the reliability of the electrical current sensor.

In addition, according to the electrical current sensor related to each of the above aspects of the invention, since the shield layer is not formed over the first substrate (the third substrate), warping of the first substrate (the third substrate) due to the stress of the shield layer does not occur. Therefore, it is not necessary to provide a stress relaxation layer on the first substrate (the third substrate), and thus the process can be simplified. In addition, it becomes possible to reduce material costs for forming a stress relaxation layer.

In this manner, according to the electrical current sensor related to each of the above aspects of the invention, generation of cracks or warping of the substrate due to the stress of the shield layer can be prevented, and thus an electrical current sensor having good reliability, linearity, and hysteresis can be realized.

In the electrical current sensor related to each of the above aspects of the invention, it is preferable that an aluminum oxide layer be formed on the surface of the first substrate and the magnetic detection element be disposed on the surface of the aluminum oxide layer.

According to another aspect of the invention, there is provided a method of manufacturing an electrical current sensor including: a step of forming a first laminated body by disposing a magnetic detection element over a first substrate, forming a protective film over the first substrate and the magnetic detection element, and forming a coil over the protective film; a step of forming a second laminated body by forming a shield layer over a second substrate; and a step of bonding the first laminated body and the second laminated body to each other with an adhesion layer interposed therebetween such that the magnetic detection element and the shield layer face each other.

Further, according to another aspect of the invention, there is provided a method of manufacturing an electrical current sensor including: a step of forming a third laminated body by disposing a magnetic detection element over a first substrate; a step of forming a fourth laminated body by forming a shield layer over a second substrate, forming a protective film over the second substrate and the shield layer, and forming a coil over the protective film; and a step of bonding the third laminated body and the fourth laminated body to each other with an adhesion layer interposed therebetween such that the magnetic detection element and the shield layer face each other.

Further, according to another aspect of the invention, there is provided a method of manufacturing an electrical current sensor including: a step of forming a first laminated body by disposing a magnetic detection element and also forming an electrode over a first substrate, forming a protective film over the first substrate and the magnetic detection element, and forming a coil over the protective film; a step of forming a fifth laminated body by forming a shield layer over a second substrate and etching the second substrate with the shield layer as a mask, thereby making the thickness of an area where the shield layer is not formed, in the second substrate, thinner than the thickness of an area where the shield layer is formed; a step of forming an adhesion layer over the first laminated body so as to expose the surface of the electrode and bonding the first laminated body and the fifth laminated body to each other with the adhesion layer interposed therebetween such that the magnetic detection element and the shield layer face each other; and a step of removing the second substrate in the area where the shield layer is not formed, by polishing.

In the method of manufacturing an electrical current sensor according to each of the above aspects of the invention, an aluminum oxide layer may be formed on the surface of the first substrate and the magnetic detection element may be disposed on the surface of the aluminum oxide layer.

BRIEF DESCRIPTION OF THE DRAWINGS

FIGS. 9A to 9C are diagrams describing a method of manufacturing an electrical current sensor of a third embodiment.

DESCRIPTION OF THE PREFERRED EMBODIMENTS

First Embodiment

Hereinafter, an embodiment of the invention will be described in detail with reference to the accompanying drawings.

Figure 1:
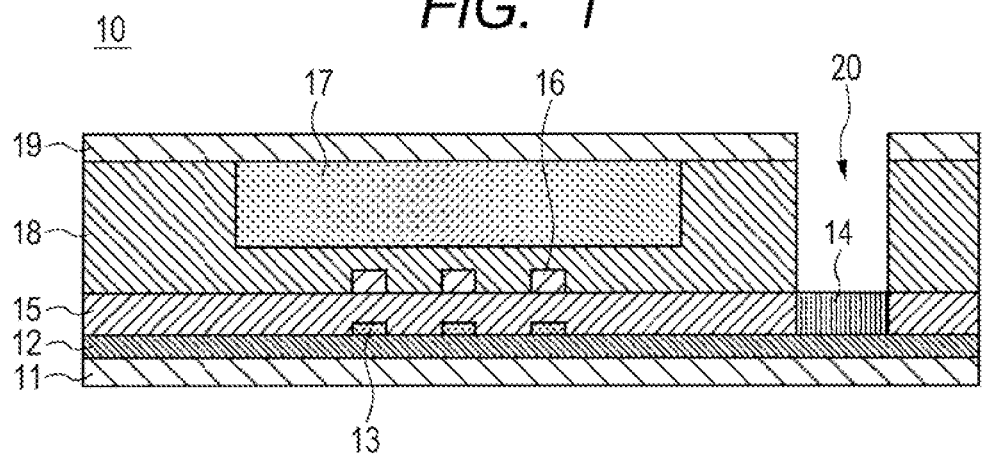
FIG. 1 is a cross-sectional schematic diagram showing an electrical current sensor of a first embodiment.

FIG. 1 is a cross-sectional schematic diagram showing an electrical current sensor 10 related to this embodiment. As shown in FIG. 1, the electrical current sensor 10 is configured to include an aluminum oxide layer 12 provided on a substrate 11, a plurality of magnetic detection elements 13 and an electrode 14 disposed on the aluminum oxide layer 12, a protective film 15 provided on the aluminum oxide layer 12 and the plurality of magnetic detection elements 13 so as to cover the magnetic detection elements 13, a plurality of coils 16 disposed on the protective film 15, a shield layer 17 disposed above the plurality of coils 16, an adhesion layer 18 provided so as to cover the protective film 15 and the plurality of coils 16 and surround the shield layer 17, and a substrate 19 provided on the shield layer 17 and the adhesion layer 18. The electrode 14 is opened through a contact hole 20 provided in the substrate 19 and the adhesion layer 18.

The electrical current sensor 10 is manufactured by bonding a laminated body A (refer to FIG. 2A) having the magnetic detection elements 13 and a laminated body B (refer to FIG. 2B) having the shield layer 17 to each other with the adhesion layer 18 interposed therebetween.

Figure 3A:
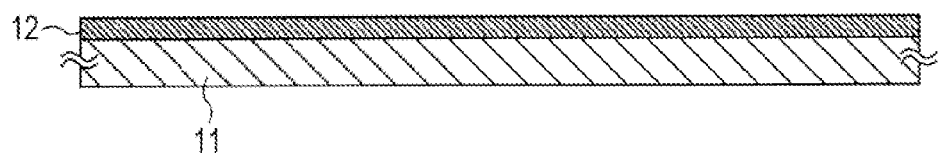
FIGS. 3A to 3D are diagrams describing a method of manufacturing the laminated body constituting the electrical current sensor.
Figure 3B:
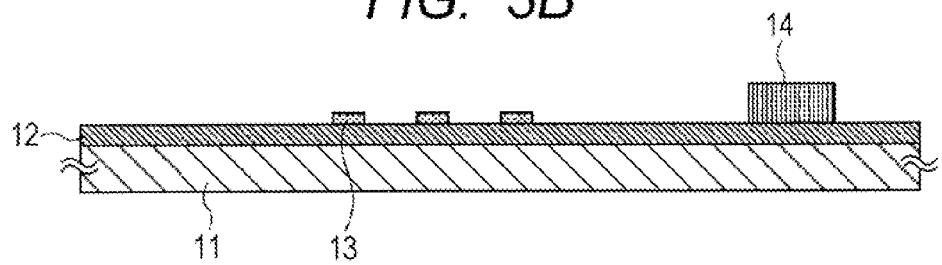
Figure 3C:
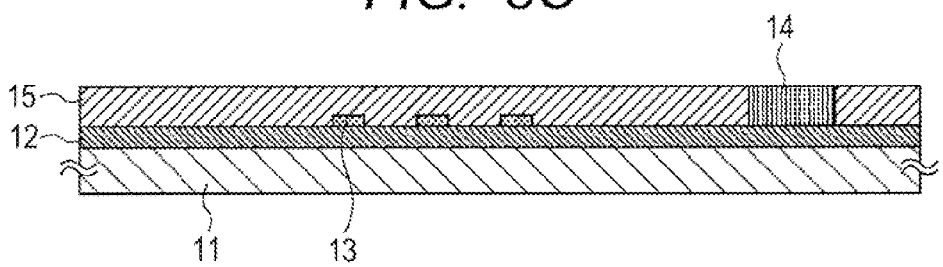
Figure 3D:
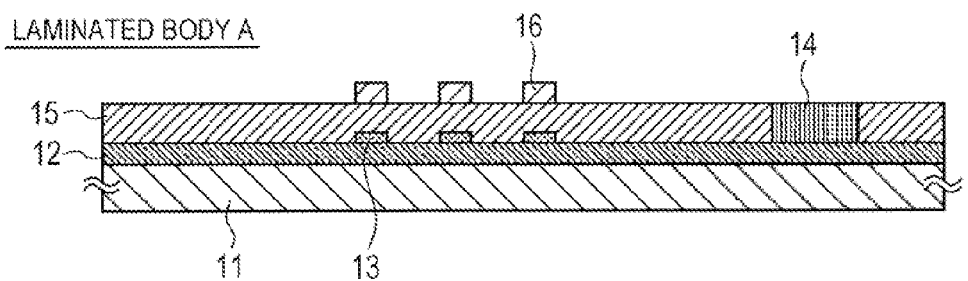
Figure 4A:
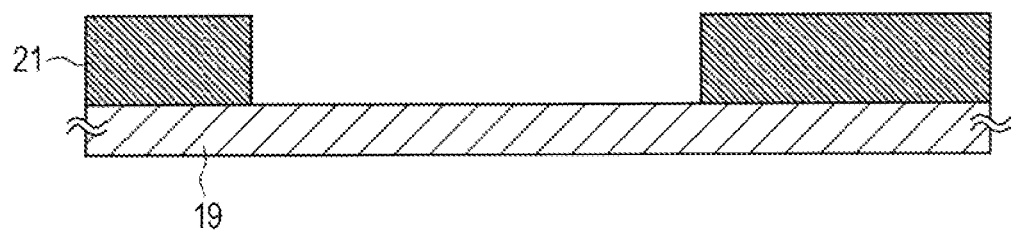
FIGS. 4A to 4C are diagrams describing a method of manufacturing the laminated body constituting the electrical current sensor.
Figure 4B:
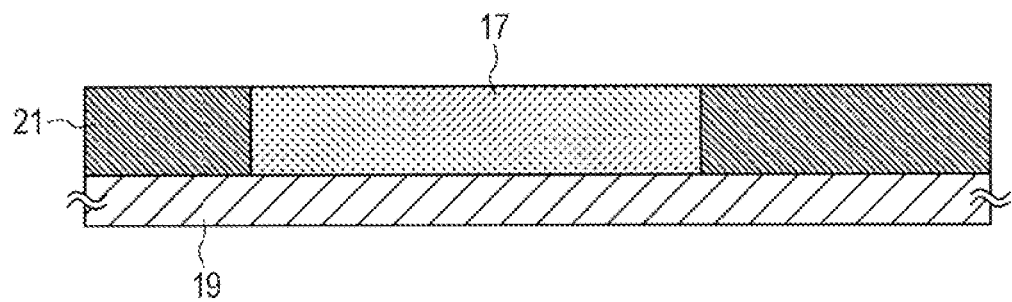
Figure 4C:
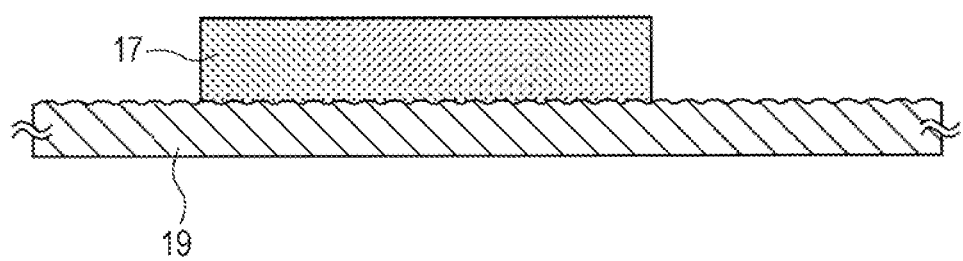
Figure 5A:
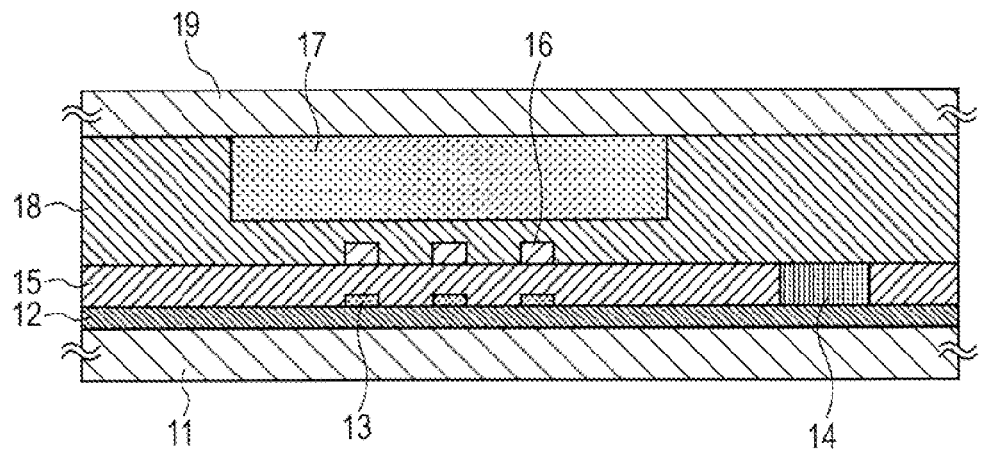
FIGS. 5A to 5C are diagrams describing a method of manufacturing the electrical current sensor.
Figure 5B:
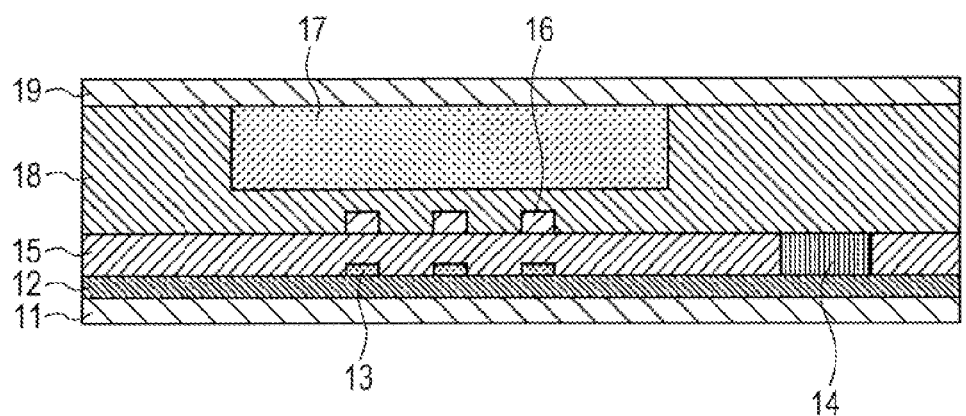
Figure 5C:
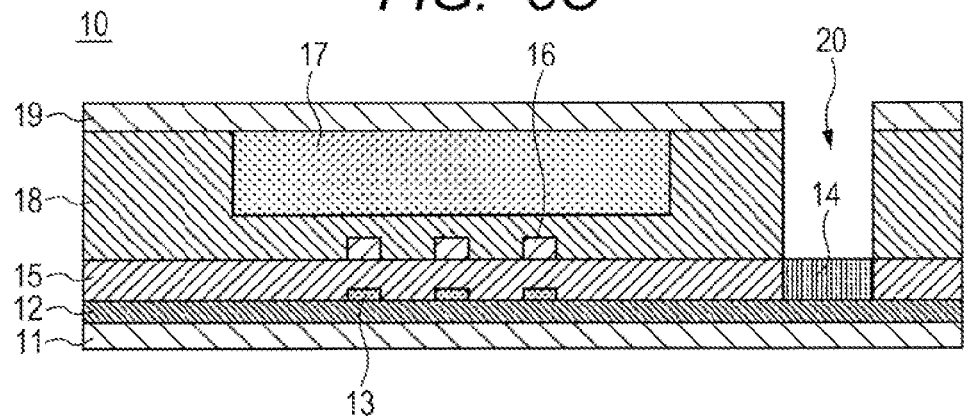

Hereinafter, a method of manufacturing the electrical current sensor 10 related to the first embodiment will be described based on FIGS. 3A to 5C. FIGS. 3A to 3D are diagrams describing a method of manufacturing the laminated body A having the magnetic detection elements 13. FIGS. 4A to 4C are diagrams describing a method of manufacturing the laminated body B having the shield layer 17. FIGS. 5A to 5C are diagrams describing a method of manufacturing the electrical current sensor 10 in which the laminated body A and the laminated body B are bonded to each other.

Figure 2A:
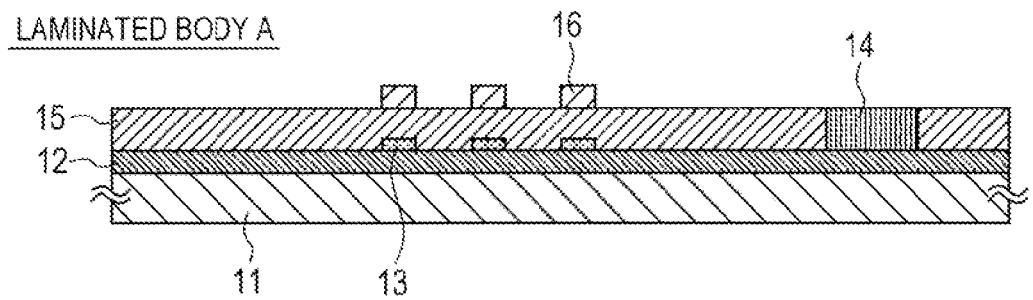
FIGS. 2A and 2B are cross-sectional schematic diagrams showing laminated bodies constituting the electrical current sensor.

First, a method of manufacturing the laminated body A shown in FIG. 2A will be described with reference to FIGS. 3A to 3D. First, the aluminum oxide layer 12 is formed on the substrate 11 (refer to FIG. 3A). As the substrate 11, for example, a silicon substrate can be used. The aluminum oxide layer 12 can be deposited by, for example, a sputtering method.

Subsequently, on the aluminum oxide layer 12, the magnetic detection elements 13 are disposed and the electrode 14 is formed (refer to FIG. 3B). As the magnetic detection element 13, a TMR element (a tunnel-type magnetoresistance effect element), a GMR element (a giant magnetoresistance effect element), or the like can be used. The electrode 14 can be formed by depositing an electrode material and then carrying out photolithography and etching.

Subsequently, the protective film 15 is formed on the aluminum oxide layer 12 and the magnetic detection elements 13 (refer to FIG. 3C). The protective film 15 is formed such that the thickness thereof becomes substantially equal to the thickness of the electrode 14 disposed on the aluminum oxide layer 12. That is, the upper surfaces of the protective film 15 and the electrode 14 are configured so as to become the same plane (such that the upper surface of the electrode 14 is exposed). As the protective film 15, a polyimide film can be applied. The polyimide film can be formed by applying a polyimide material and then hardening it.

Subsequently, the coils 16 are formed on the protective film 15 (refer to FIG. 3D). In this way, the laminated body A is completed. The coil 16 can be formed by depositing a coil material and then carrying out photolithography and etching. Alternatively, the coil 16 can also be formed by depositing a base material and then carrying out photolithography and plating.

Figure 2B:
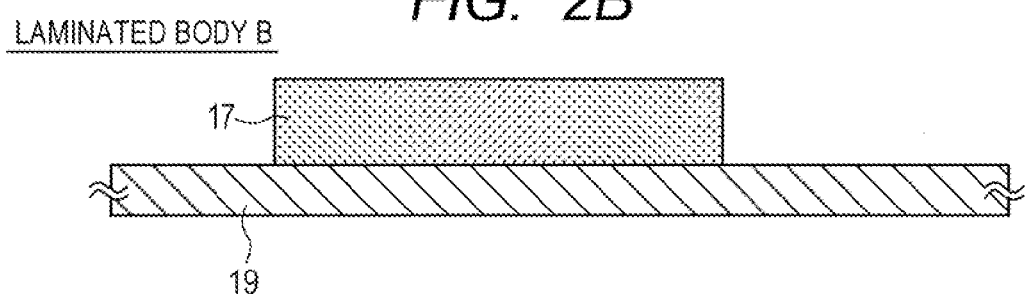

Next, a method of manufacturing the laminated body B shown in FIG. 2B will be described with reference to FIGS. 4A to 4C. First, a resist pattern 21 taking into account the pattern shape of the shield layer 17 is formed on the substrate 19 (refer to FIG. 4A). As the substrate 19, for example, a silicon substrate can be used, similarly to the substrate 11.

Subsequently, after the shield layer 17 is formed on the substrate 19 by a plating method (refer to FIG. 4B), the resist pattern 21 is removed (refer to FIG. 4C). In this way, the laminated body B is completed. The shield layer 17 is formed to a thickness of 15 μm or more by a plating method.

As shown in FIG. 4C, minute irregularities are present in the surface of the substrate 19. Therefore, at a lower surface portion of the shield layer 17 formed on the substrate 19, irregularities are formed as a reflection of the irregularities of the surface of the substrate 19. On the other hand, an exposed upper surface portion of the shield layer 17 formed on the substrate 19 becomes a flat surface in which irregularities are leveled by the thickness of the shield layer 17. In addition, for convenience, in the drawings other than FIG. 4C, the surface of the substrate 19 is depicted as a flat surface.

After the formation of the shield layer 17, it is preferable to determine whether or not a desired composition has been obtained in the shield layer 17 (determination of suitability of the shield layer 17) by analyzing the composition of the shield layer 17 by an SEM. Further, it is preferable to determine whether or not cracks have been generated in a lower surface edge of the shield layer 17 due to the stress of the shield layer 17. Then, as the laminated body B constituting the electrical current sensor 10, it is preferable to select and use a laminated body in which a desired composition is obtained in the shield layer 17 and cracks are not generated in the lower surface edge of the shield layer 17.

Next, a method of manufacturing the electrical current sensor 10 by bonding the obtained laminated bodies A and B to each other will be described with reference to FIGS. 5A to 5C. First, an adhesive constituting the adhesion layer 18 is applied onto the electrode 14, the protective film 15, and the coils 16 of the laminated body A and the laminated body B is bonded thereto such that the shield layer 17 and the coils 16 face each other. At the time of adhesion of the laminated body A and the laminated body B, position matching of the magnetic detection element 13 in the laminated body A and the shield layer 17 in the laminated body B is performed by using an alignment marker and the adhesion is then performed. Further, the amount of application of the adhesive is controlled such that the distance between the facing surfaces of the coil 16 in the laminated body A and the shield layer 17 in the laminated body B becomes equal to or less than 5 μm.

Thereafter, the adhesive is hardened, whereby the laminated body A and the laminated body B are laminated with the adhesion layer 18 interposed therebetween (refer to FIG. 5A). As the adhesive constituting the adhesion layer 18, it is suitable to use an adhesive made of a polymer such as polyimide that is thermally cured at low temperature, in order to reduce damage to each member constituting the laminated bodies A and B due to temperature rise. Further, as a material constituting the adhesion layer 18, it is preferable to use a material having good compatibility with a material constituting the protective film 15.

Subsequently, after the upper and lower substrates 11 and 19 are polished (refer to FIG. 5B), the contact hole 20 to the electrode 14 is formed by dicing or the like (refer to FIG. 5C). In this way, the electrical current sensor 10 shown in FIG. 1 is completed.

In this manner, by manufacturing the electrical current sensor 10 by bonding the laminated body A and the laminated body B to each other, a configuration is obtained in which the upper surface side of the shield layer 17 in the laminated body B is disposed close to the magnetic detection elements 13 in the laminated body A. In the shield layer 17 in the laminated body B, a composition is controlled more easily in the upper surface side than in the initial layer which is formed on the substrate 19 side. The upper surface side of the shield layer 17, in which it is easy to control a composition in this manner, is disposed to come close to the magnetic detection elements 13, whereby it becomes possible to make the linearity and the hysteresis of the electrical current sensor 10 good.

Further, by manufacturing the electrical current sensor 10 by bonding the laminated body A and the laminated body B to each other, it is possible to manufacture the electrical current sensor 10 without directly forming the shield layer 17 on the protective film formed on the coils 16. Therefore, it is possible to avoid even the lower surface of the shield layer 17 being undulated according to undulation of the upper surface of the protective film formed on the coils 16. In addition, since the shield layer 17 is not directly formed on the thinned protective film, it is possible to avoid generation of cracks in the protective film due to the stress of the shield layer 17.

Further, in the electrical current sensor 10, an upper surface portion of the shield layer 17 in the laminated body B is constituted by a flat surface. In the electrical current sensor 10, the flat upper surface side of the shield layer 17 is disposed to come close to the magnetic detection elements 13, whereby it becomes possible to make the linearity and the hysteresis of the electrical current sensor 10 good.

On the other hand, a lower surface portion coming into contact with the substrate 19, of the shield layer 17 in the laminated body B, is constituted by a surface having irregularities. Therefore, in the electrical current sensor 10, the surface of the shield layer 17 on the coil 16 side is constituted by a flat surface and the surface of the shield layer 17 on the substrate 19 side is constituted by a surface having irregularities.

In addition, in the electrical current sensor 10, as the substrate 11 and the magnetic detection element 13 in the laminated body A or the substrate 19 and the shield layer 17 in the laminated body B, those having good characteristics are selected and used. In this way, compared to a case of manufacturing s current sensor by performing lamination in order from the substrate 11 to the shield layer 17, as in the electrical current sensor of the related art, it becomes possible to improve the yield of the electrical current sensor 10. That is, in the electrical current sensor of the related art, lamination is performed in order from the substrate 11, and thus if a defect occurs at a stage where the shield layer 17 is finally formed, the entire current sensor becomes defective. In contrast, in the electrical current sensor 10, even if a defect occurs at a stage where the shield layer 17 is formed, since only the laminated body B becomes defective, the yield of the electrical current sensor 10 can be improved.

In addition, in the electrical current sensor 10, in a case where cracks are generated in the lower surface edge of the shield layer 17 in the laminated body B, the laminated body B is not used in bonding. Accordingly, generation of cracks in the lower surface edge of the shield layer 17 in the electrical current sensor 10 is prevented, and thus it becomes possible to improve the reliability of the electrical current sensor 10.

Further, in the electrical current sensor 10, since the shield layer 17 is not directly formed on the substrate 11 by a plating method, warping of the substrate 11 due to the stress of the shield layer 17 does not occur. Therefore, it is not necessary to provide a stress relaxation layer on the substrate 11, and thus the process can be simplified. In addition, it becomes possible to reduce a material cost for forming a stress relaxation layer.

In this manner, according to the electrical current sensor 10 related to this embodiment, generation of cracks or warping of the substrate 11 due to the stress of the shield layer 17 can be prevented, and thus an electrical current sensor having good reliability, linearity, and hysteresis can be realized.

Second Embodiment

An electrical current sensor 30 which is manufactured by a different manufacturing method from the electrical current sensor 10 shown in the first embodiment will be described. A method of manufacturing the electrical current sensor 30 related to the second embodiment is different from the method of manufacturing the electrical current sensor 10 related to the first embodiment in that the coils 16 are not included in a laminated body A2 side having the magnetic detection elements 13 and the coils 16 are included in a laminated body B2 side having the shield layer 17.

Figure 6A:
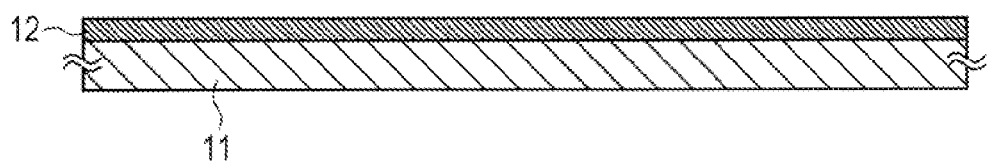
FIGS. 6A and 6B are diagrams describing a method of manufacturing a laminated body constituting an electrical current sensor of a second embodiment.
Figure 6B:
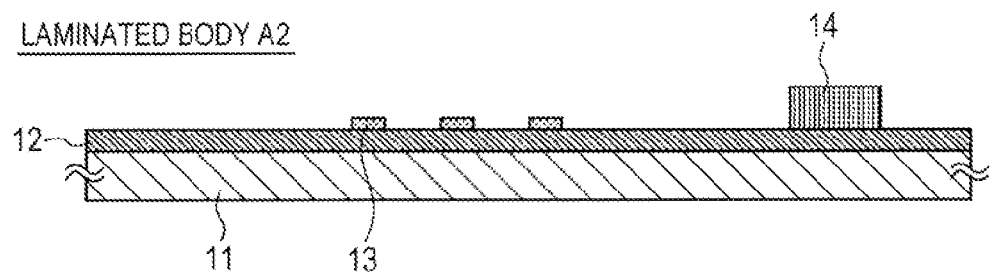
Figure 7A:
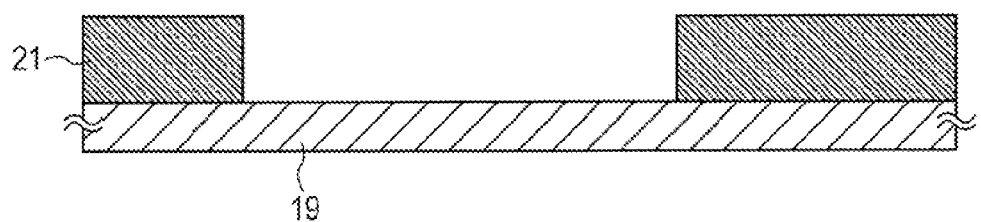
FIGS. 7A to 7E are diagrams describing a method of manufacturing a laminated body constituting the electrical current sensor.
Figure 7B:
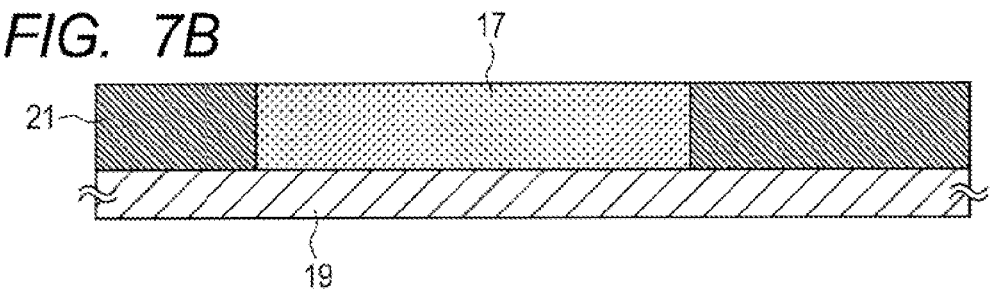
Figure 7C:
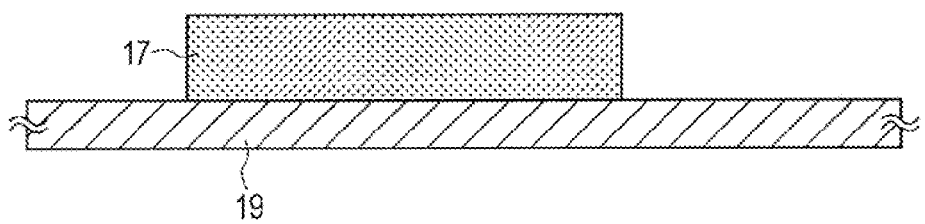
Figure 7D:
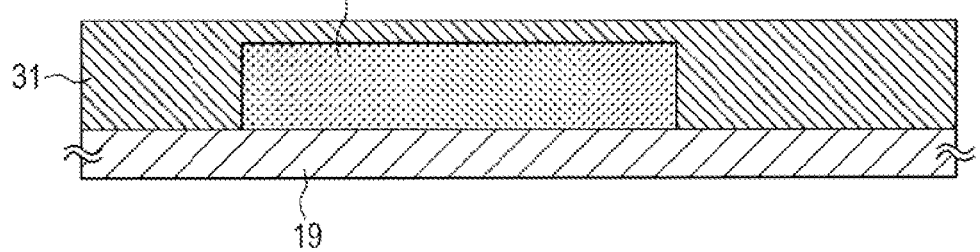
Figure 7E:
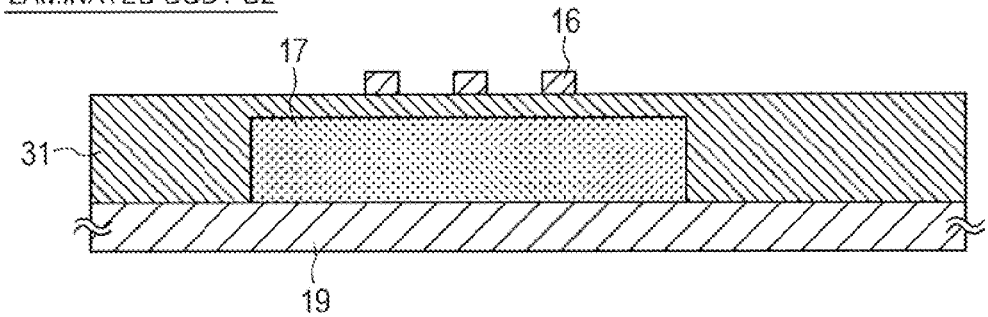
Figure 8A:
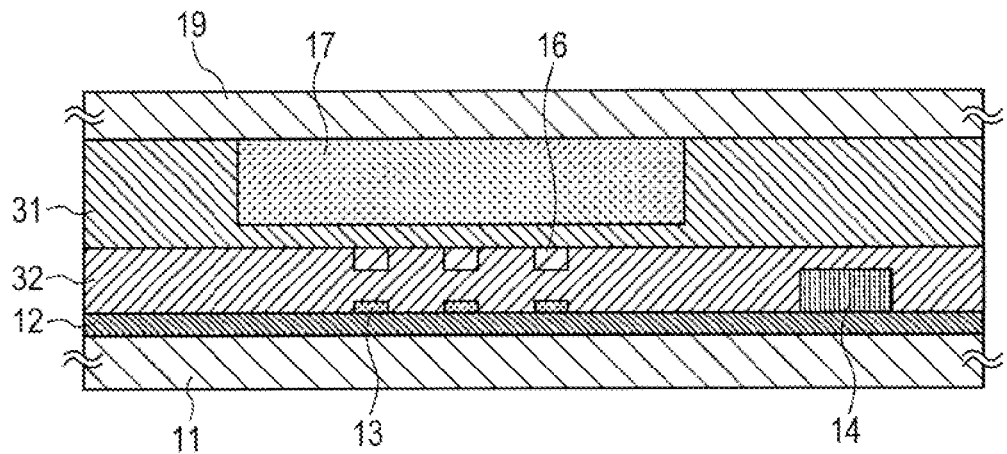
FIGS. 8A to 8C are diagrams describing a method of manufacturing the electrical current sensor.
Figure 8B:
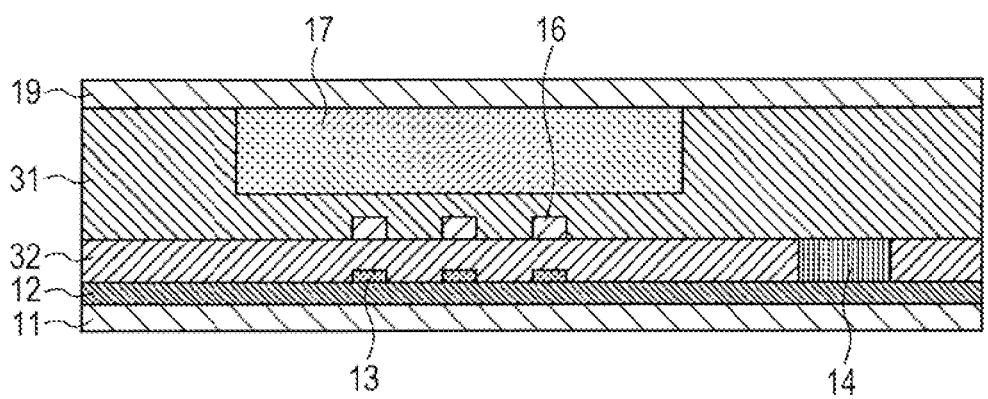
Figure 8C:
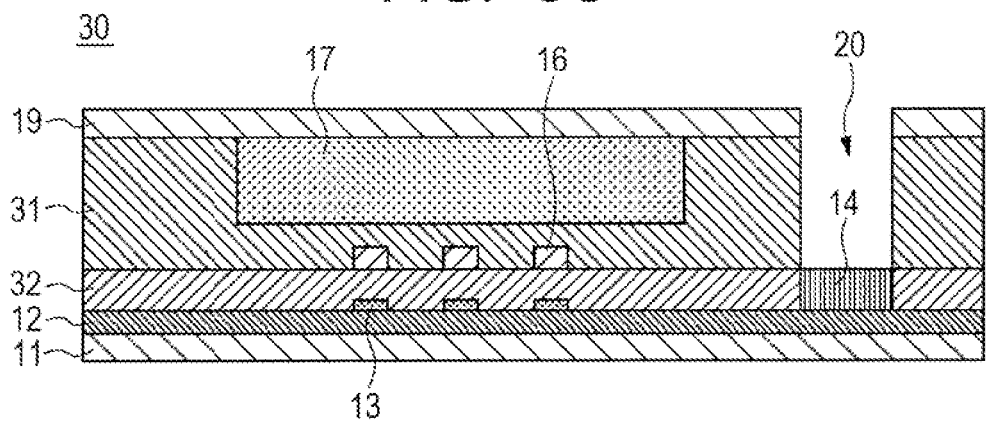
Figure 10A:
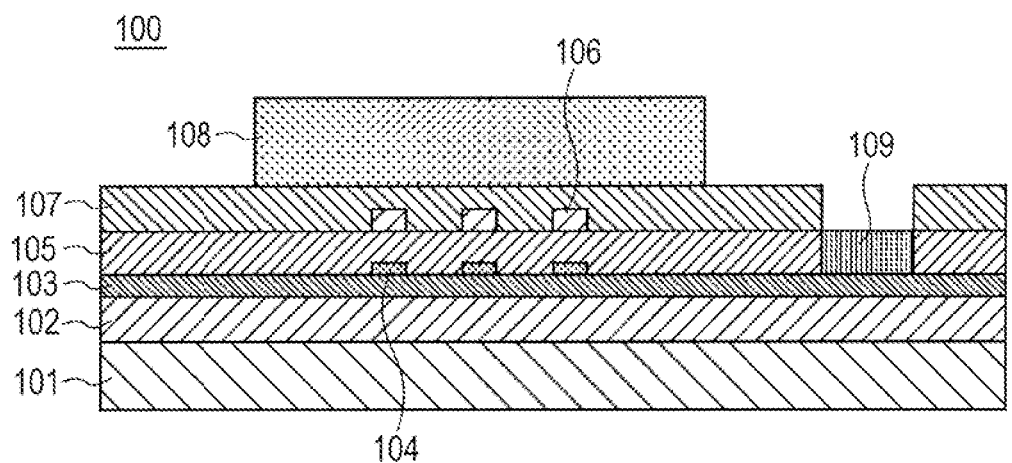
FIGS. 10A and 10B are cross-sectional schematic diagrams showing an electrical current sensor of the related art.
Figure 10B:
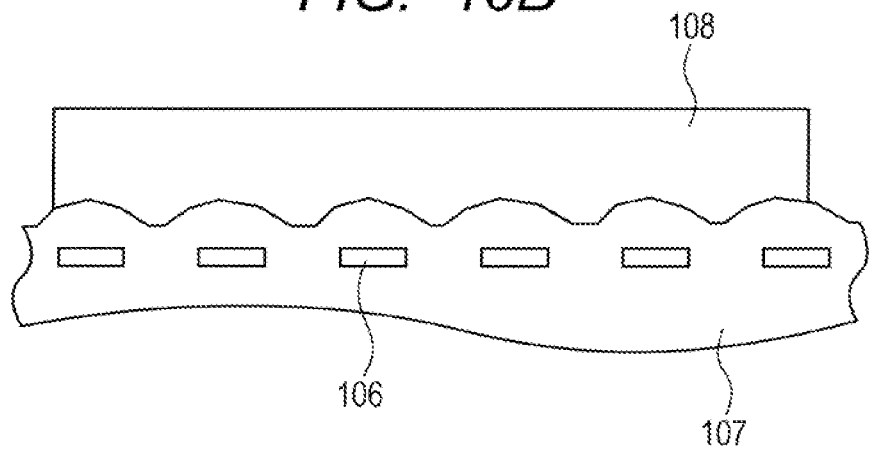

Hereinafter, the method of manufacturing the electrical current sensor 30 related to the second embodiment will be described based on FIGS. 6A to 8C. FIGS. 6A and 6B are diagrams describing a method of manufacturing the laminated body A2 having the magnetic detection elements 13. FIGS. 7A to 7E are diagrams describing a method of manufacturing the laminated body B2 having the shield layer 17. FIGS. 8A to 8C are diagrams describing a method of manufacturing the electrical current sensor 30 in which the laminated body A2 and the laminated body B2 are bonded to each other. In addition, in the second embodiment, a configuration which is common to the method of manufacturing the electrical current sensor 10 related to the first embodiment is denoted by the same reference numeral and description thereof is omitted.

First, a method of manufacturing the laminated body A2 will be described with reference to FIGS. 6A and 6B. First, the aluminum oxide layer 12 is formed on the substrate 11 (refer to FIG. 6A). Subsequently, on the aluminum oxide layer 12, the magnetic detection elements 13 are disposed and the electrode 14 is formed (refer to FIG. 6B). In this way, the laminated body A2 is completed.

Next, a method of manufacturing the laminated body B2 will be described with reference to FIGS. 7A to 7E. First, the resist pattern 21 taking into account the pattern shape of the shield layer 17 is formed on the substrate 19 (refer to FIG. 7A). Subsequently, after the shield layer 17 is formed on the substrate 19 by a plating method (refer to FIG. 7B), the resist pattern 21 is removed (refer to FIG. 7C).

Subsequently, a protective film 31 is formed on the substrate 19 and the shield layer 17 (refer to FIG. 7D). The protective film 31 is formed such that the thickness thereof becomes equal to or less than 5 µm from the upper surface of the shield layer 17. As the protective film 31, a polyimide film can be applied. The polyimide film can be formed by applying a polyimide material and then hardening it.

Subsequently, the coils 16 are formed on the protective film 31 (refer to FIG. 7E). In this way, the laminated body B2 is completed.

Next, a method of manufacturing the electrical current sensor 30 by bonding the obtained laminated bodies A2 and B2 to each other will be described with reference to FIGS. 8A to 8C. First, an adhesive constituting an adhesion layer 32 is applied onto the aluminum oxide layer 12 and the magnetic detection elements 13 of the laminated body A2 and the laminated body B2 is bonded thereto such that the coils 16 and the magnetic detection elements 13 face each other. At the time of adhesion of the laminated body A2 and the laminated body B2, position matching of the magnetic detection element 13 in the laminated body A2 and the shield layer 17 in the laminated body B2 is performed by using an alignment marker and the adhesion is then performed.

Thereafter, the adhesive is hardened, whereby the laminated body A2 and the laminated body B2 are laminated with the adhesion layer 32 interposed therebetween (refer to FIG. 8A).

Subsequently, after the upper and lower substrates 11 and 19 are polished (refer to FIG. 8B), the contact hole 20 to the electrode 14 is formed by dicing or the like (refer to FIG. 8C). In this way, the electrical current sensor 30 is completed.

In this manner, by manufacturing the electrical current sensor 30 by bonding the laminated body A2 and the laminated body B2 to each other, a configuration is obtained in which the upper surface side of the shield layer 17 in the laminated body B2 is disposed close to the magnetic detection elements 13 in the laminated body A2. In the shield layer 17 in the laminated body B2, a composition is controlled more easily in the upper surface side than in the initial layer which is formed on the substrate 19 side. The upper surface side of the shield layer 17, in which it is easy to control a composition in this manner, is disposed to come close to the magnetic detection elements 13, whereby it becomes possible to make the linearity and the hysteresis of the electrical current sensor 30 good.

Further, by manufacturing the electrical current sensor 30 by bonding the laminated body A2 and the laminated body B2 to each other, it is possible to manufacture the electrical current sensor 30 without directly forming the shield layer 17 on the protective film formed on the coils 16. Therefore, it is possible to avoid even the lower surface of the shield layer 17 being undulated according to undulation of the upper surface of the protective film formed on the coils 16. In addition, since the shield layer 17 is not directly formed on the thinned protective film, it is possible to avoid generation of cracks in the protective film due to the stress of the shield layer 17.

Further, in the electrical current sensor 30, an upper surface portion of the shield layer 17 in the laminated body B2 is constituted by a flat surface. In the electrical current sensor 30, the flat upper surface side of the shield layer 17 is disposed to come close to the magnetic detection elements 13, whereby it becomes possible to make the linearity and the hysteresis of the electrical current sensor 30 good.

On the other hand, a lower surface portion coming into contact with the substrate 19, of the shield layer 17 in the laminated body B2, is constituted by a surface having irregularities. Therefore, in the electrical current sensor 30, the surface of the shield layer 17 on the coil 16 side is constituted by a flat surface and the surface of the shield layer 17 on the substrate 19 side is constituted by a surface having irregularities.

Further, in the electrical current sensor 30, since the shield layer 17 is not directly formed on the substrate 11 by a plating method, warping of the substrate 11 due to the stress of the shield layer 17 does not occur. Therefore, it is not necessary to provide a stress relaxation layer on the substrate 11, and thus the process can be simplified. In addition, it becomes possible to reduce a material cost for forming a stress relaxation layer.

In this manner, according to the electrical current sensor 30 related to this embodiment, generation of cracks or warping of the substrate 11 due to the stress of the shield layer 17 can be prevented, and thus an electrical current sensor having good reliability, linearity, and hysteresis can be realized.

Third Embodiment

An electrical current sensor 40 which is manufactured by a different manufacturing method from the electrical current sensor 10 shown in the first embodiment will be described. In a method of manufacturing the electrical current sensor 40 related to the third embodiment, a method of manufacturing the contact hole 20 for opening the electrode 14 is different from that in the method of manufacturing the electrical current sensor 10 related to the first embodiment.

Hereinafter, the method of manufacturing the electrical current sensor 40 related to the third embodiment will be described based on FIGS. 9A to 9C. In addition, in the third embodiment, a configuration which is common to the method of manufacturing the electrical current sensor 10 related to the first embodiment is denoted by the same reference numeral and description thereof is omitted.

In the electrical current sensor 40, as a laminated body having the magnetic detection elements 13, the same laminated body as the laminated body A (refer to FIG. 2A) related to the first embodiment is used. On the other hand, as a laminated body having the shield layer 17, a laminated body B3 having a different configuration from the laminated body B (refer to FIG. 2B) related to the first embodiment is used.

The laminated body B3 is manufactured from the laminated body B related to the first embodiment by etching the substrate 19 with the shield layer 17 as a mask. In this way, the thickness of a portion 19a where the shield layer 17 is not disposed, of the substrate 19, is configured to be thin, compared to the thickness of a portion 19b where the shield layer 17 is disposed (refer to FIG. 9A).

Subsequently, the electrical current sensor 40 is manufactured by bonding the laminated body A and the laminated body B3 to each other. First, an adhesive constituting an adhesion layer 41 is applied onto the protective film 15 and the coils 16 of the laminated body A. At this time, a configuration is made such that the adhesion layer 41 is not formed on the electrode 14. For example, a mask may also be disposed on the electrode 14 when applying the adhesive, and after the adhesive is applied, the adhesive on the electrode 14 may also be removed.

Then, the laminated body B3 is bonded to the laminated body A such that the shield layer 17 and the coils 16 face each other. At the time of adhesion of the laminated body A and the laminated body B3, position matching of the magnetic detection element 13 in the laminated body A and the shield layer 17 in the laminated body B3 is performed by using an alignment marker and the adhesion is then performed. Further, the amount of application of the adhesive is controlled such that the distance between the facing surfaces of the coil 16 in the laminated body A and the shield layer 17 in the laminated body B3 becomes equal to or less than 5 µm.

Thereafter, the adhesive is hardened, whereby the laminated body A and the laminated body B3 are laminated with the adhesion layer 41 interposed therebetween (refer to FIG. 9B).

Subsequently, the upper and lower substrates 11 and 19 are polished. At this time, in the substrate 19, by performing the polishing until the etched portion 19a is entirely removed, the contact hole 20 is formed at the same time as the polishing of the substrate 19 (refer to FIG. 9C). In this way, the electrical current sensor 40 is completed.

In this manner, by manufacturing the electrical current sensor 40 by bonding the laminated body A and the laminated body B3 to each other, a configuration is obtained in which the upper surface side of the shield layer 17 in the laminated body B3 is disposed close to the magnetic detection elements 13 in the laminated body A. In the shield layer 17 in the laminated body B3, a composition is controlled more easily in the upper surface side than in the initial layer which is formed on the substrate 19 side. The upper surface side of the shield layer 17, in which it is easy to control a composition in this manner, is disposed to come close to the magnetic detection elements 13, whereby it becomes possible to make the linearity and the hysteresis of the electrical current sensor 40 good.

Further, by manufacturing the electrical current sensor 40 by bonding the laminated body A and the laminated body B3 to each other, it is possible to manufacture the electrical current sensor 40 without directly forming the shield layer 17 on the protective film formed on the coils 16. Therefore, it is possible to avoid even the lower surface of the shield layer 17 being undulated according to undulation of the upper surface of the protective film formed on the coils 16. In addition, since the shield layer 17 is not directly formed on the thinned protective film, it is possible to avoid generation of cracks in the protective film due to the stress of the shield layer 17.

Further, in the electrical current sensor 40, an upper surface portion of the shield layer 17 in the laminated body B3 is constituted by a flat surface. In the electrical current sensor 40, the flat upper surface side of the shield layer 17 is disposed to come close to the magnetic detection elements 13, whereby it becomes possible to make the linearity and the hysteresis of the electrical current sensor 40 good.

On the other hand, a lower surface portion coming into contact with the substrate 19, of the shield layer 17 in the laminated body B3, is constituted by a surface having irregularities. Therefore, in the electrical current sensor 40, the surface of the shield layer 17 on the coil 16 side is constituted by a flat surface and the surface of the shield layer 17 on the substrate 19 side is constituted by a surface having irregularities.

Further, in the electrical current sensor 40, since the shield layer 17 is not directly formed on the substrate 11 by a plating method, warping of the substrate 11 due to the stress of the shield layer 17 does not occur. Therefore, it is not necessary to provide a stress relaxation layer on the substrate 11, and thus the process can be simplified. In addition, it becomes possible to reduce a material cost for forming a stress relaxation layer.

In addition, the invention is not limited to the embodiments described above and can be implemented with various changes. In the embodiments described above, a size, a shape, or the like shown in the accompanying drawings is not limited thereto and a change can be appropriately made within a scope demonstrating the effects of the invention. In addition, the invention can be implemented with appropriate changes unless they depart from the scope of the object of the invention.

For example, in the embodiments described above, a case where the shield layer 17 is formed by a plating method has been described. However, a method of forming the shield layer 17 is not limited thereto and an appropriate change is possible. For example, the shield layer 17 can also be formed by a sputtering method.

It should be understood by those skilled in the art that various modifications, combinations, sub-combinations and alterations may occur depending on design requirements and other factors insofar as they are within the scope of the appended claims of the equivalents thereof.

What is claimed is:

1. An electrical current sensor comprising:
a first laminated body having a first substrate, an aluminum oxide layer formed directly on the first substrate, a magnetic detection element disposed over the first substrate with the aluminum oxide layer interposed therebetween, a protective film formed over the first substrate and the magnetic detection element, and a coil formed on the protective film; and
a second laminated body having a second substrate and a shield layer formed on the second substrate,
wherein the first laminated body and the second laminated body are bonded to each other with an adhesion layer interposed therebetween such that the magnetic detection element and the shield layer face each other.

2. An electrical current sensor comprising:
a first laminated body having a first substrate, an aluminum oxide layer formed directly on the first substrate, and a magnetic detection element disposed over the first substrate with the aluminum oxide layer interposed therebetween; and
a second laminated body having a second substrate, a shield layer formed on the second substrate, a protective film formed over the second substrate and the shield layer, and a coil formed on the protective film,
wherein the first laminated body and the second laminated body are bonded to each other with an adhesion layer interposed therebetween such that the magnetic detection element and the shield layer face each other.

3. A method of manufacturing an electrical current sensor, the method comprising:
forming a first laminated body, including:
forming an aluminum oxide layer directly on a surface of a first substrate;
disposing a magnetic detection element on the aluminum oxide layer formed on the first substrate;
forming a protective film over the first substrate and the magnetic detection element; and
forming a coil on the protective film;
forming a second laminated body by forming a shield layer over a second substrate; and
bonding the first laminated body and the second laminated body to each other with an adhesion layer interposed therebetween such that the magnetic detection element and the shield layer face each other.

4. A method of manufacturing an electrical current sensor, the method comprising:
forming a first laminated body, including:
forming an aluminum oxide layer directly on a surface of a first substrate; and
disposing a magnetic detection element on the aluminum oxide layer on the first substrate;

forming a second laminated body, including:
forming a shield layer on a second substrate;
forming a protective film over the second substrate and the shield layer; and
forming a coil on the protective film; and
bonding the first laminated body and the second laminated body to each other with an adhesion layer interposed therebetween such that the magnetic detection element and the shield layer face each other.

5. A method of manufacturing an electrical current sensor, the method comprising:
forming a first laminated body, including:
disposing a magnetic detection element and an electrode over a first substrate;
forming a protective film over the first substrate and the magnetic detection element, the protective film exposing a surface of the electrode; and
forming a coil over the protective film;
forming a second laminated body, including:
forming a shield layer over a second substrate; and
etching the second substrate with the shield layer as a mask, thereby making an area of the second substrate where the shield layer is not formed have a thickness smaller than a thickness of the second substrate under the shield layer;
forming an adhesion layer over the first laminated body so as to expose the surface of the electrode;
bonding the first laminated body and the second laminated body to each other with the adhesion layer interposed therebetween such that the magnetic detection element and the shield layer face each other; and
removing the second substrate in the area where the shield layer is not formed, by polishing.

6. The method of manufacturing an electrical current sensor according to claim 5, further comprising:
forming an aluminum oxide layer on the surface of the first substrate before disposing the magnetic detection element and the electrode such that the magnetic detection element and the electrode are disposed on a surface of the aluminum oxide layer.

7. An electrical current sensor comprising:
a first laminated body having a first substrate, a magnetic detection element disposed over the first substrate, a protective film formed over the first substrate and the magnetic detection element, and a coil formed on the protective film; and
a second laminated body having a second substrate and a shield layer formed on the second substrate,
wherein the first laminated body and the second laminated body are bonded to each other with an adhesion layer interposed therebetween such that the magnetic detection element and the shield layer face each other, whereby a distance between the magnetic detection element and the shield layer is smaller than a distance between the magnetic detection element and a surface of the second substrate facing the magnetic detection element.

8. An electrical current sensor comprising:
a first laminated body having a first substrate and a magnetic detection element disposed over the first substrate; and
a second laminated body having a second substrate, a shield layer formed on the second substrate, a protective film formed over the second substrate and the shield layer, and a coil formed on the protective film,
wherein the first laminated body and the second laminated body are bonded to each other with an adhesion layer interposed therebetween such that the magnetic detection element and the shield layer face each other, whereby a distance between the magnetic detection element and the shield layer is smaller than a distance between the magnetic detection element and a surface of the second substrate facing the magnetic detection element.

\* \* \* \* \*